(12) United States Patent
Shimizu

(10) Patent No.: US 6,507,111 B2
(45) Date of Patent: Jan. 14, 2003

(54) HIGH-FREQUENCY CIRCUIT AND ITS MODULE FOR COMMUNICATION DEVICES

(75) Inventor: Junichi Shimizu, Tokyo (JP)

(73) Assignee: NEC Corporation, Tokyo (JP)

(*) Notice: Subject to any disclaimer, the term of this patent is extended or adjusted under 35 U.S.C. 154(b) by 63 days.

(21) Appl. No.: 09/842,243

(22) Filed: Apr. 25, 2001

(65) Prior Publication Data

US 2001/0038146 A1 Nov. 8, 2001

(30) Foreign Application Priority Data

Apr. 26, 2000 (JP) .................................. 2000-126102

(51) Int. Cl.⁷ .............................................. H01L 23/34
(52) U.S. Cl. ....................... 257/728; 257/503; 257/691; 257/723
(58) Field of Search ................................ 257/728, 503, 257/723, 691

(56) References Cited

U.S. PATENT DOCUMENTS

| | | | |
|---|---|---|---|
| 4,686,492 A | * | 8/1987 | Grellmann et al. .......... 174/261 |
| 5,371,755 A | * | 12/1994 | Murata et al. ............ 372/38.02 |
| 5,606,196 A | * | 2/1997 | Lee et al. .................... 257/503 |
| 6,414,387 B1 | * | 7/2002 | Hara et al. ................... 257/691 |
| 6,434,726 B1 | * | 8/2002 | Goossen ......................... 716/5 |

FOREIGN PATENT DOCUMENTS

JP          10-275957          10/1998

* cited by examiner

*Primary Examiner*—Amir Zarabian
*Assistant Examiner*—Douglas Menz
(74) *Attorney, Agent, or Firm*—Katten, Muchin, Zavis, Rosenman

(57) ABSTRACT

A high-frequency circuit is provided, which makes it possible to prevent degradation of its high-frequency characteristic even if the lengths of bonding wires used are not decreased. This circuit includes: (a) an electronic element having a capacitance; (b) a signal line for transmitting a high-frequency electric signal to the element; (c) a terminating resistor for impedance matching; (d) a first bonding wire for electrically connecting the signal line and the element; and (e) a second bonding wire for electrically connecting the element and the resistor. A characteristic impedance of combination of the element and the first and second bonding wires is equal to or greater than that of input side of the electric signal with respect to the combination. An inductance of the second wire is greater than that of the first wire. Preferably, at least one of the lengths of the first and second bonding wires is decreased, which enhances the advantage of the high-frequency circuit.

15 Claims, 7 Drawing Sheets

HIGH-FREQUENCY CIRCUIT AND ITS MODULE FOR COMMUNICATION DEVICES

BACKGROUND OF THE INVENTION

1. Field of the Invention

The present invention relates to a communication apparatus or device such as an optical communication apparatus/device (e.g., a light source or an optical transmitter) and a radio communication apparatus/device (e.g., a portable phone), and more particularly, to a High-Frequency (HF) circuit to be mounted on a communication apparatus/device of this type that prevents its HF characteristic from degrading, and a module equipped therewith.

2. Description of the Related Art

With optical communications systems, signal light is generated by direct or indirect modulation method of the output light of a semiconductor laser as a light source according to a signal to be transmitted in the transmission side. Then, the signal light thus generated is sent to an optical detector in the reception side by way of a medium.

In the direct modulation method of light, a semiconductor laser itself is driven with an intensity- or frequency-modulated current according to a signal to be transmitted, thereby generating the signal light. On the other hand, in the indirect modulation method of light, a semiconductor laser is driven with a dc current to generate output light with a constant intensity and then, the output light thus generated is modulated by an intensity-, frequency-, or phase-modulation method with an external modulator according to a signal to be transmitted, thereby generating the signal light.

As known well, when the bit rate of information is in the order of gigabits per second (i.e., Gb/sec) or higher, the transmittable distance is limited due to wavelength chirping occurring in the direct modulation method. Therefore, the indirect modulation method of light is used for transmission at such the high bit rate as above.

It is usual that an external modulator is formed in the form of module. For example, only an external modulator is formed as a module. Alternately, an external modulator and a light source (e.g., a semiconductor laser) are combined together to form a module, which is termed the "modulator-integrated light source" module.

In recent years, the bit rate of information or data to be transmitted has been becoming higher (e.g., Gb/sec or higher). Therefore, to transmit the information from the transmission side to the reception side without any errors, there is the increasing need to improve the high-frequency characteristics of the external modulator. To meet this need, various improved modules of this type have been developed and disclosed.

FIGS. 1 and 2 show the configuration of an example of the prior-art modulator-integrated light source modules. As seen from these figures, on a conductive base 101, a dielectric substrate 102 and a heat sink 103 are formed to be apart from each other at a small distance. The dielectric substrate 102 is, for example, made of alumina ($Al_2O_3$). The sink 103 is made of material with high thermal conductivity.

A modulator-integrated light source chip 120 is mounted on the sink 103, where the chip 120 comprises a semiconductor laser 109 and an external modulator 110. The sink 103 serves to cool the chip 120, i.e., to dissipate the heat generated by the chip 120. The sink 103 is mechanically and electrically connected to the base 101 by way of a conductive via hole 111b.

On the surface of the dielectric substrate 102, a patterned conductive layer is deposited, forming a strip-shaped signal line 107 and two ground lines 108a and 108b at each side of the signal line 107. The surface of the substrate 102 is exposed from the lines 107, 108a and 108b through two elongated windows. The signal line 107 and the ground lines 108a and 108b constitute a coplanar-type transmission line. The ground lines 108a and 108b are mechanically and electrically connected to the base 101 by way of conductive via holes 111a. The signal line 107 is not electrically connected to the base 101.

A matching resistor 104, which serves as a terminator for impedance matching, is formed on the exposed surface of the dielectric layer 102 between the signal line 107 and the ground line 108b. The resistor 104 is located near the end of the signal line 107, which is in the vicinity of the heat sink 103. The two ends of the resistor 104 are mechanically and electrically connected to the lines 107 and 108b, respectively. The resistor 104 is of the chip type or thin-film type.

The signal line 107 is electrically connected to the heat sink 103 by way of a conductive bonding wire 105. One end of the wire 105 is bonded to the nearer end of the line 107 to the sink 103. The other end of the wire 105 is bonded to the sink 103 at its nearest edge to the line 107. The heat sink 103 is electrically connected to the external modulator 110 of the chip 120 by way of a conductive bonding wire 106. One end of the wire 106 is bonded to the sink 103 at its nearest edge to the line 107. The other end of the wire 106 is bonded to the pad of the modulator 110 of the chip 120. The laser 109 is supplied with an electric, driving current by way of a conductive bonding wire 112.

A high-frequency electrical input signal $S_{IN}$ to be transmitted is applied to the signal line 107 from its furthest end from the heat sink 103. The signal $S_{IN}$ is then sent to the external modulator 110 of the modulator-integrated light source chip 120 by way of the signal line 107, the bonding wires 105 and 106, and the sink 103. The modulator 110 modulates the output light of the laser 109 according to the signal $S_{IN}$ thus inputted, generating the signal light. The signal light thus generated is emitted from the chip 120 and the modulator-integrated light source module.

With the prior-art module shown in FIGS. 1 and 2, as described above, the external modulator 110 of the modulator-integrated light source chip 120 and the dielectric substrate 102 are located to be apart from each other at a specific small distance, thereby decreasing the lengths of the bonding wires 105 and 106. Thus, the inductance components of the wires 105 and 106 are restricted, suppressing the degradation of the high-frequency characteristic of the modulator 110.

However, it is often that the distance between the dielectric substrate 102 and the modulator-integrated light source chip 120 is unable or difficult to be short as desired due to requirements in designing the module of this type. In other words, the bonding wires 105 and 106 are often unable to be short as desired. As a result, there is a limit in the method of preventing degradation of the high-frequency characteristic of the module by decreasing the lengths of the bonding wires. It is preferred that this problem is solved by a different method if possible.

In addition, the Japanese Non-Examined Patent Publication No. 10-275957 published in 1998 discloses an optical semiconductor chip carrier. This carrier comprises the same technique as described above while a microstrip line is used as the transmission line for the input signal $S_{IN}$ into the external modulator 110.

SUMMARY OF THE INVENTION

Accordingly, an object of the present invention is to provide a high-frequency circuit that makes it possible to prevent degradation of its high-frequency characteristic by a different method from the above-described method of decreasing the lengths of bonding wires used.

Another object of the present invention is to provide a high-frequency circuit module that makes it possible to prevent degradation of its high-frequency characteristic by a different method from the above-described method of decreasing the lengths of bonding wires used.

The above objects together with others not specifically mentioned will become clear to those skilled in the art from the following description.

According to a first aspect of she present invention, a high-frequency circuit is provided, which comprises:

(a) an electronic element having a capacitance;

(b) a signal line for transmitting a high-frequency electric signal to the element;

(c) a terminating resistor for impedance matching;

(d) a first bonding wire for electrically connecting the signal line and the element; and (e) a second bonding wire for electrically connecting the element and the resistor;

wherein a characteristic impedance of combination of the element and the first and second bonding wires is equal to or greater than that of input side of the electric signal with respect to the combination;

and wherein an inductance of the second wire is greater than that of the first wire.

With the high-frequency circuit according to the first aspect of the present invention, the characteristic impedance of the combination of the electronic element and the first and second bonding wires is equal to or greater than the characteristic impedance of the input side of the high-frequency electric signal with respect to the combination. Also, The inductance of the second bonding wire is greater than the inductance of the first bonding wire. Therefore, the high-frequency characteristic of the high-frequency circuit according to the first aspect is prevented from degrading by the use of a different method from the above-described method of decreasing the lengths of the first and second bonding wires.

Needless to say, if at least one of the lengths of the first and second bonding wires is decreased, the above-described advantage of the circuit of the first aspect of the invention is enhanced.

In a preferred embodiment of the circuit according to the first aspect, the element has a conductive pad. The element and the first wire are electrically connected to each other at the pad while the element and the second wire are electrically connected to each other at the same pad.

In another preferred embodiment of the circuit according to the first aspect, the electronic element has a first conductive pad and a second conductive pad. The element and the first wire are electrically connected to each other at the first pad while the element and the second wire are connected to each other at the second pad.

In still another preferred embodiment of the circuit according to the first aspect, a conductive island electrically connected to the element by way of a third bonding wire is additionally provided. The signal line is electrically connected to the island by way of the first wire, thereby electrically connecting the signal line to the element by way of the first and third wires. The resistor is electrically connected to the island by way of the second wire, thereby electrically connecting the resistor to the element by way of the second and third wires.

In a further preferred embodiment of the circuit according to the first aspect, the element is a modulator for generating an electric or optical signal by modulation according to the electric signal transmitted through the signal line.

In a still further preferred embodiment of the circuit according to the first aspect, the inductance of the second wire is approximately twice in value the inductance of the first wire.

According to a second aspect of the present invention, a high-frequency circuit module is provided, which comprises a base and the high-frequency circuit according to the first aspect mounted on the base.

With the high-frequency circuit module according to the second aspect of the invention, the high-frequency circuit according to the first aspect is mounted on the base. Thus, there is the same advantage as that of the circuit of the first aspect.

In a preferred embodiment of the module according to the second aspect, the element is mounted on a heat sink fixed to the base and the signal line is located on a dielectric layer formed on the base. The resistor is fixed directly on the base.

In another preferred embodiment of the module according to the second aspect, the element is mounted on a heat sink fixed to the base and the signal line is located on a dielectric layer formed on the base. The resistor is fixed on the sink.

According to a third aspect of the present invention, a communication device is provided, which comprises the high-frequency circuit module according to the second aspect.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
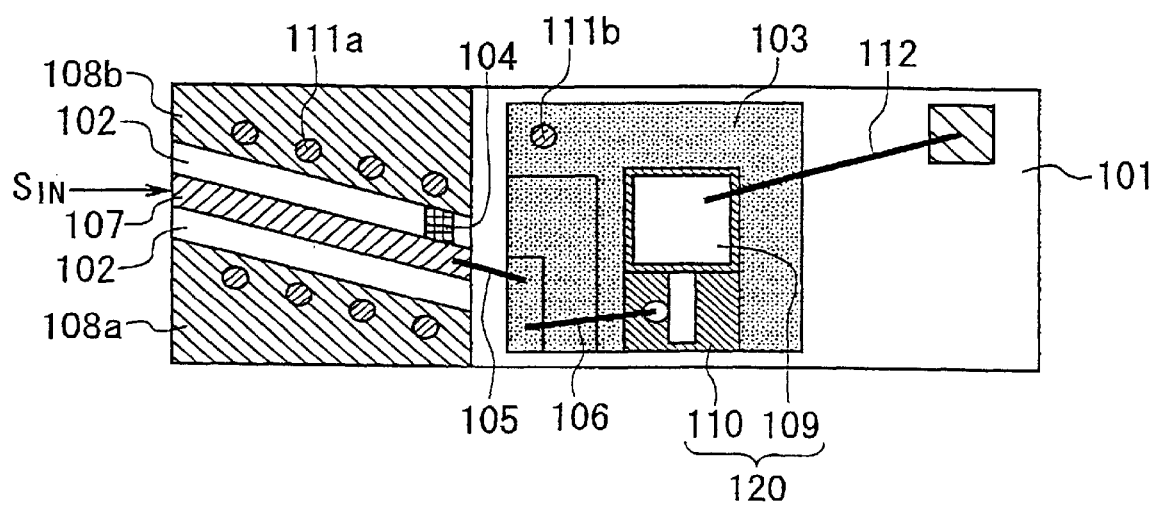
FIG. 1 is a schematic plan view showing the internal configuration of a prior-art modulator-integrated light source module.

Preferred embodiments of the present invention will be described in detail below while referring to the drawings attached.

FIRST EMBODIMENT

Figure 3:
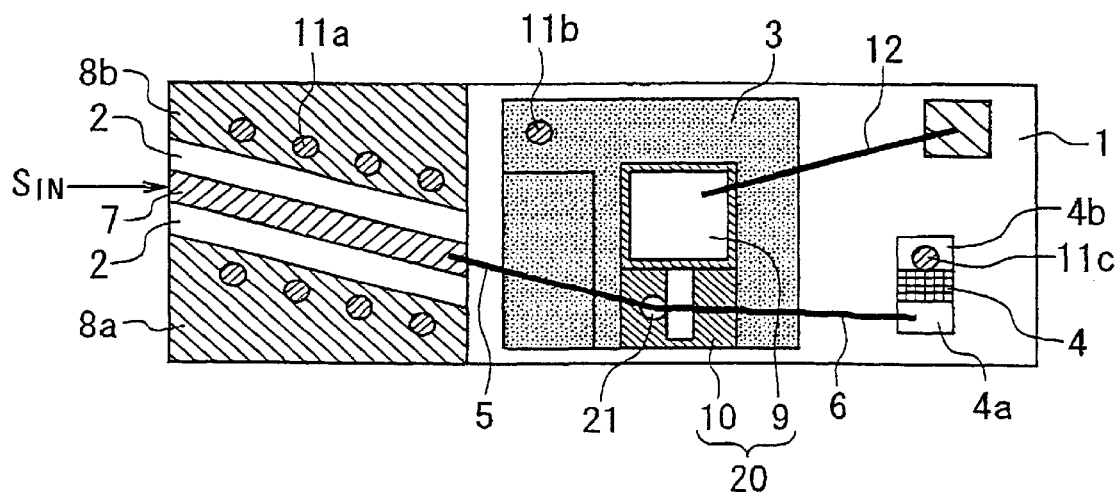
FIG. 3 is a schematic plan view showing the internal configuration of a modulator-integrated light source module according to a first embodiment of the invention.
Figure 4:
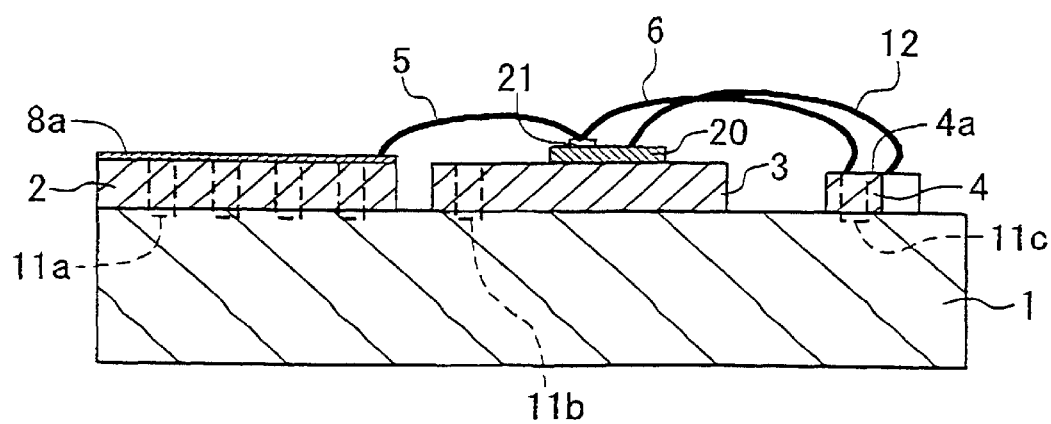
FIG. 4 is a schematic side view showing the internal configuration of the modulator-integrated light source module according to the first embodiment of FIG. 3.

As shown in FIGS. 3 and 4, a high-frequency circuit module according to a first embodiment of the invention, which is a modulator-integrated light source module, comprises a block-shaped conductive base 1, a dielectric substrate 2, a heat sink 3, a modulator-integrated light source chip 20, and a matching resistor 4. The substrate 2, the sink 3, and the resistor 4 are mounted on the surface of the base 1. The substrate 2 and the resistor 4 are located at opposite sides to each other with respect to the sink 3. The sink 3 is apart from the substrate 2 and the resistor 4 at small distances. The chip 20 is mounted on the sink 3. The chip 20 comprises a semiconductor laser 9 and an external modulator 10. The resistor 4 is of the chip type or thin-film type.

The dielectric substrate 2 is, for example, made of alumina ($Al_2O_3$). The heat sink 3 serves to cool the modulator-integrated light source chip 20 mounted thereon, i.e., to dissipate the heat generated by the chip 20. The sink 3 is mechanically and electrically connected to the base 1 by way of a conductive via hole (e.g., a plated via hole) 11b.

On the surface of the dielectric substrate 2, a patterned conductive layer is deposited, forming a strip-shaped signal line 7 and two ground lines 8a and 8b at each side of the line 7. The surface of the substrate 2 is exposed from the lines 7, 8a and 8b through two elongated windows. The signal line 7 and the ground lines 8a and 8b constitute a coplanar-type transmission line. The ground lines 8a and 8b are electrically connected to the conductive base 1 by way of conductive via holes 11a. The signal line 7 is not electrically connected too the base 1.

Instead of the coplanar-type transmission line formed by the lines 7, 8a, and 8b, any microstrip line may be used as the transmission line for the input signal $S_{IN}$ into the external modulator 10.

The matching resistor 4, which serves as a terminator for impedance matching in the module, is mounted on the surface of the base 1 at the opposite side to the substrate 2 with respect to the sink 3. One end or terminal 4b of the resistor 4 is electrically connected to the base 1 by way of a conductive via hole 11c.

One end of a conductive bonding wire 5 is bonded to the near end of the signal line 7 while the other end thereof is bonded to a bonding pad 21 of the external modulator 10 of the chip 20. Thus, the signal line 7 is electrically connected to the modulator 10 by way of the bonding wire 5.

One end of a conductive bonding wire 6 is bonded to the bonding pad 21 of the modulator 10 of the chip 20 while the other end thereof is bonded to the other end or another terminal 4a of the resistor 4. Thus, the modulator 10 is electrically connected to the resistor 4 by way of the bonding wire 6. As described above, the terminal 4b of the resistor 4 is electrically connected to the base 11 by way of the via hole 11c.

Thus, the signal line 7 is electrically connected to the external modulator 10 of the chip 20 by way of the bonding wire 5 and at the same time, the line 7 is electrically connected to the matching resistor 4 by way of the bonding wires 5 and 6 and the common bonding pad 21. In other words, the modulator 10 and the resistor 4 are electrically connected in parallel to the line 7.

A high-frequency electric input signal $S_{IN}$ to be transmitted is applied to the signal line 7 from its opposite end to the heat sink 3. The signal $S_{IN}$ is then sent to the external modulator 10 of the modulator-integrated light source chip 20 by way of the signal line 7 and the bonding wire 5. The modulator 10 modulates the output light of the laser 9 with a constant intensity according to the electric signal $S_{IN}$ thus inputted, generating the signal light. The signal light thus generated is emitted from the chip 20 and the modulator-integrated light source module.

The length of the bonding wires 5 and 6 is so determined as to satisfy the following conditions (i) and (ii).

(i) The characteristic impedance of combination of the external modulator 10 of the modulator-integrated light source chip 20 and the bonding wires 5 and 6 is equal to or greater than the characteristic impedance of the input side of the high-frequency input signal $S_{IN}$ with respect to the same combination, (ii) The inductance of the bonding wire 6 is greater in value than the inductance of the bonding wire 5.

The laser 9 is supplied with an electric, driving current by way of a conductive bonding wire 12.

With the high-frequency circuit module (i.e., modulator-integrated light source module) according to the first embodiment of FIGS. 3 and 4, the characteristic impedance of the combination of the external modulator 10 of the modulator-integrated light source chip 20 and the bonding wires 5 and 6 is equal to or greater than the characteristic impedance of the input side of the high-frequency electric signal $S_{IN}$ with respect to the same combination. Also, The inductance of the bonding wire 6 is greater in value than the inductance of the bonding wire 5. Therefore, the degradation of the high-frequency characteristic of the high-frequency circuit module of the first embodiment is prevented by the use of a different method from the previously-described method of decreasing the lengths of the bonding wires 105 and 106 in the prior-art module.

Figure 9:
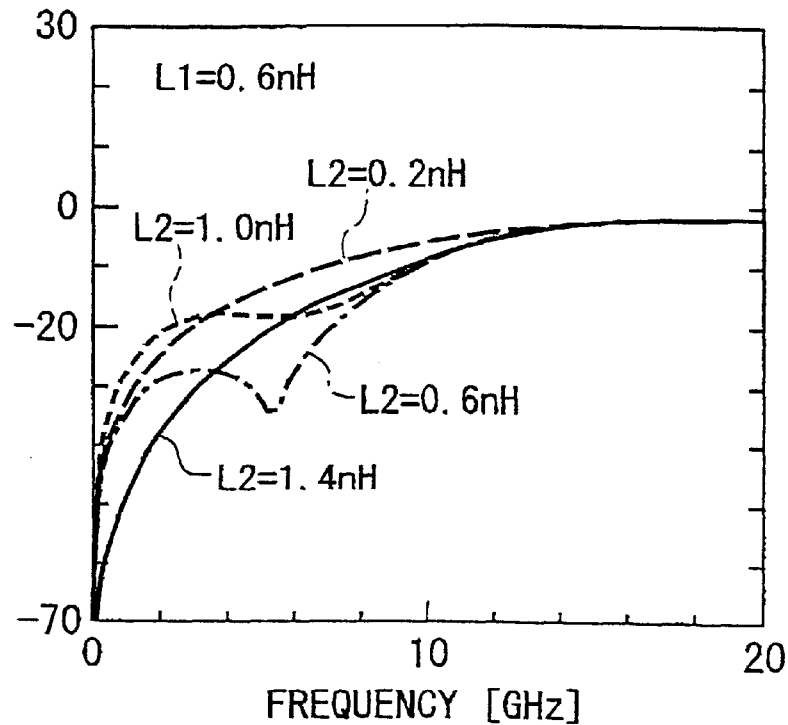
FIG. 9 is a graph showing the frequency characteristic of the parameter S11 of the module according to the first embodiment of FIG. 3.
Figure 10:
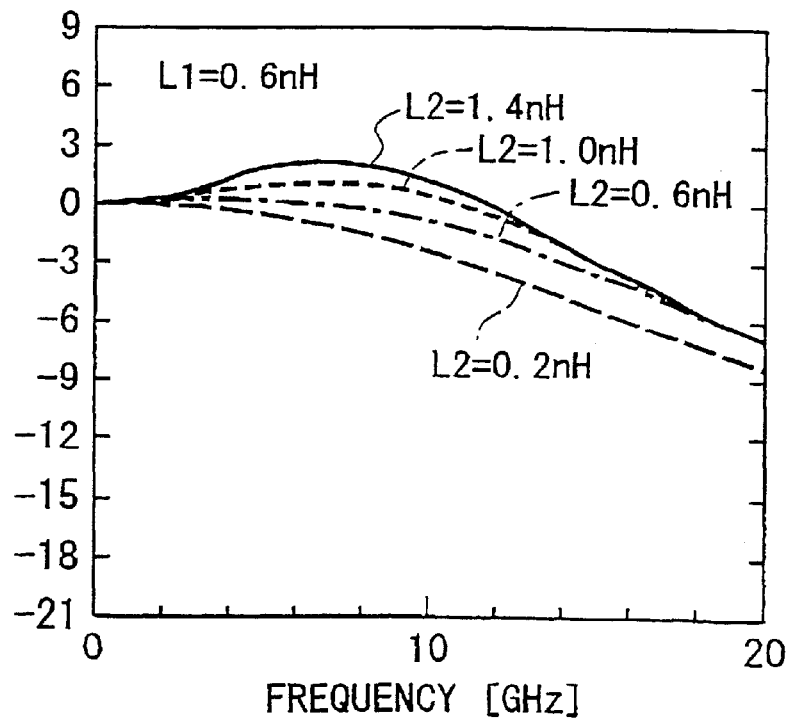
FIG. 10 is a graph showing the frequency characteristic of the parameter S21 of the module according to the first embodiment of FIGS. 3 and 3.

FIGS. 9 and 10 show the frequency characteristic of the S parameters of the module according to the first embodiment of FIGS. 3 and 4, where the inductance L2 of the bonding wire 6 was set at 0.2 nH, 0.6 nH, 1.0 nH, and 1.4 nH while the inductance L1 of the bonding wire 5 was kept at 0.6 nH.

In FIG. 9, the parameter S11 is shown, which indicates the high-frequency reflection characteristic of the module. As seen from FIG. 9, when the inductance L2 of the wire 6 is 0.2 nH and 0.6 nH, which are equal to or less than the inductance L1 (0.6 nH) of the wire 5, the return loss exceeds −10 dB at the frequency of 10 GHz or higher. This means that the high-frequency reflection characteristic degrades at the frequency of 10 GHz or higher. On the other hand, when the inductance L2 of the wire 6 is 1.0 nH and 1.4 nH, which are greater than the inductance L1 (0.6 nH) of the wire 5, the return loss does not exceed −10 dB. This means that the high-frequency reflection characteristic does not degrade.

Moreover, in FIG. 10, the parameter S21 is shown, which indicates the frequency response characteristic of the module. As seen from FIG. 10, in the region where the value of S21 is equal to −3 dB or lower, the curve of the inductance L2 of the wire 6 approaches to a straight line when the inductance L2 is less than the inductance L1 (=0.6 nH). Unlike this, the curve of the inductance L2 of the wire 6 is approximately kept the same when the inductance L2 is equal to or greater than the inductance L1 (=0.6 nH).

Accordingly, it is seen that the inductances L1 and L2 are preferably set to satisfy the relationship of L1≦L2. To realize the relationship of L1≦L2, for example, the length of the bonding wire 5 is set to be shorter than that of the bonding wire 6. According to this condition, the length of the wire 5 is set at 0.6 mm and the length of the wire 6 is set at 1.0 mm in the module of the first embodiment. In this case, the value of S11 at 10 GHz was −10 dB while the −3 dB region of S21 was given at 15 GHz, as seen from FIGS. 9 and 10, respectively.

Figure 11:
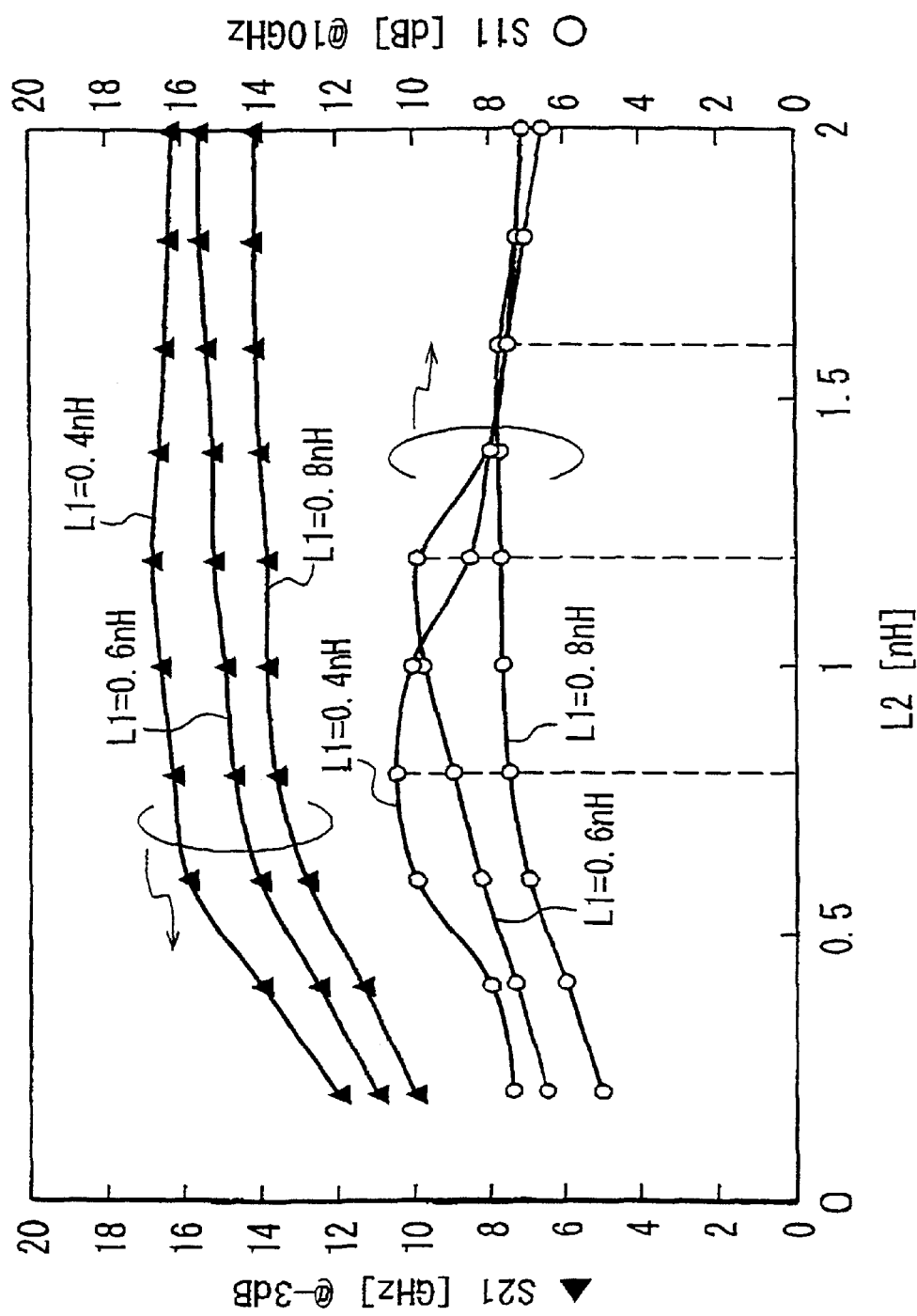
FIG. 11 is a graph showing the variation of the parameters S11 and S21 of the module according to the first embodiment of FIGS. 3 and 4 as a function of the inductance of the bonding wire.

FIG. 11 shows the change of the −3 dB region of S21 and the value of S11 at 10 GHz as a function of the inductance L2 of the wire 6, where the inductance L1 of the wire 5 is used as a parameter.

As seen from FIG. 11, the inductances L1 and L2 of the wires 5 and 6 are dependent on each other. It is also seen that if the relationship of L1≦L2 is satisfied, the −3 dB region of S21 is held to be approximately equal to that of the impedance matched state while the degradation of the value of S11 is effectively restrained.

Additionally, it is seen from FIG. 11 that if the relationship of L1≦L2 is satisfied, the high-frequency characteristic changes scarcely, even if the length of the wire 6 fluctuates due to unwanted positional shift in the mounting processes of the heat sink 3 and resistor 4 on the base 1 to thereby change the inductance L2 of the wire 6. This means that the tolerance of the parameter S21 against the change or fluctuation of the length of the wire 6 is expanded.

Moreover, as seen from FIG. 11, when the length of the wires 5 and 6 are determined in such a way that the inductances L1 and L2 satisfy the relationship of 2×L1=L2, the value of S11 is optimized. For example, when L1=0.4 nH and L2=0.8 nH, or L1=0.6 nH and L2=1.2 nH, or L1=0.8 nH and L2=1.6 nH, the value of S11 is optimized.

Here, supposing that the external modulator 10 of the chip 20 has a capacitance C, the characteristic impedance Z of the LC transmission line formed by the capacitance C of the modulator 10 and the inductances L1 and L2 of the bonding wires 5 and 6 is given by the following equation (1).

$$Z = \sqrt{\frac{(L1 - L2)}{C}} \quad (1)$$

If the characteristic impedance Z of the LC transmission line is equal to the characteristic impedance $Z_0$ of the input signal line 7, the value of S21 is maximized and the value of S11 is minimized. However, in practical use, it is unnecessary that the value of S21 is maximized and the value of S11 is minimized.

Figure 2:
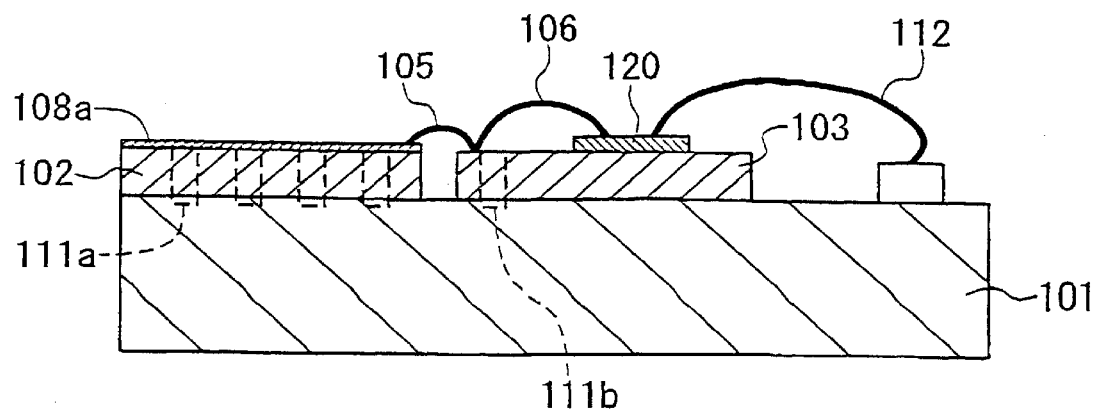
FIG. 2 is a schematic side view showing the internal configuration of the prior-art modulator-integrated light source module of FIG. 1.
Figure 12:
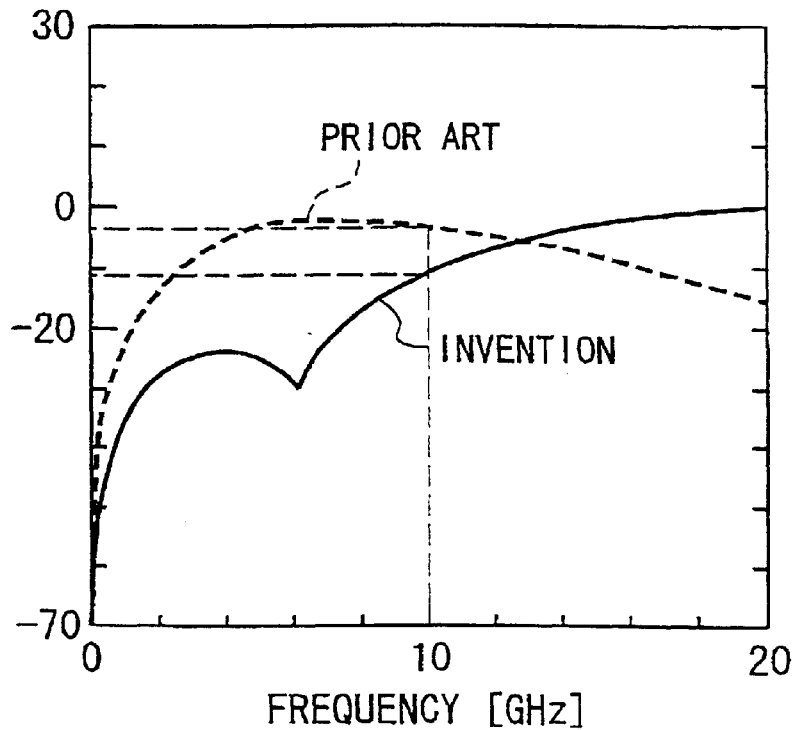
FIG. 12 is a graph showing the frequency characteristic of the parameter S11 of the module according to the first embodiment of FIGS. 3 and 4 and the prior-art module of FIGS. 1 and 2.
Figure 13:
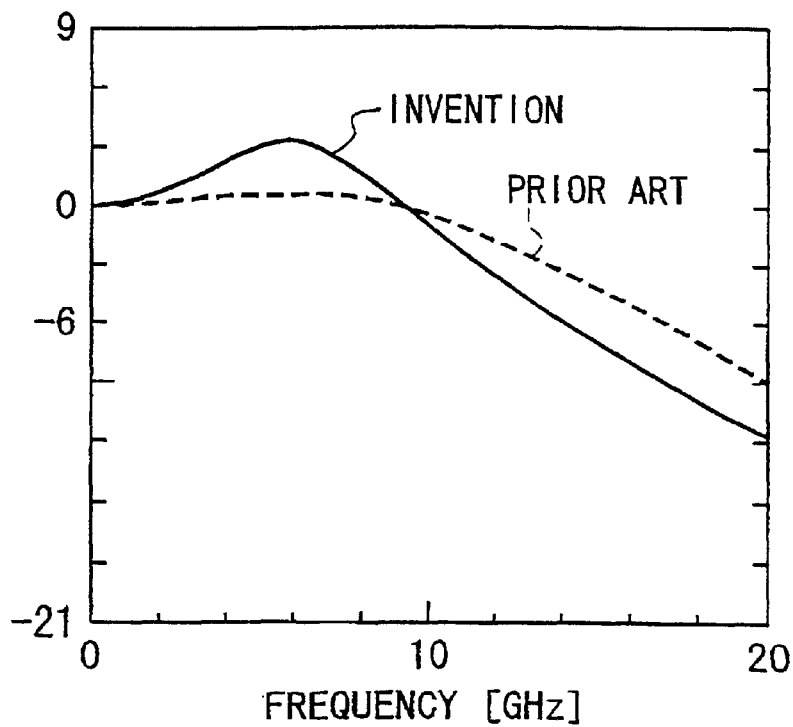
FIG. 13 is a graph showing the frequency characteristic of the parameter S21 of the module according to the first embodiment of FIGS. 3 and 4 and the prior-art module of FIGS. 1 and 2.

FIGS. 12 and 13 show the frequency characteristic of the parameters S11 and S12 of the module according to the first embodiment of FIGS. 3 and 4 and the prior-art module of FIGS. 1 and 2, respectively.

As seen from FIGS. 12 and 13, in practical use, the value of S21 may not be maximized even when the value of S11 is minimized due to impedance mismatching. In this case, however, if the value of S21 exceeds a specific reference value (e.g., 14 GHz in FIGS. 12 and 13), it is preferred that the value of S11 is set as small as desired.

In the examples of FIGS. 12 and 13, Z is given as 50 Ω when L1=0.4 nH, L2=0.8 nH, and C=0.48 pF. Z is given as 61 Ω when L1=0.6 nH, L2=1.2 nH, and C=0.48 pF. Since $Z_0$ has a normal value of 50 Ω, the relationship of $Z \geq Z_0$ is preferably satisfied.

The curves of the invention in FIGS. 12 and 13 were obtained when $Z=Z_0=50$ Ω, L1=0.6 nH, and L2=1.4 nH in the module of the first embodiment while the curves of the prior-art module of FIGS. 1 and 2 were obtained when L1=0.3 nH, and L2=0.2 nH. As seen from these figures, the reflection characteristic S11 and the frequency characteristic S21 of the module of the first embodiment are improved by approximately 6 dB and approximately 2 GHz compared with those of the prior art module.

SECOND EMBODIMENT

Figure 5:
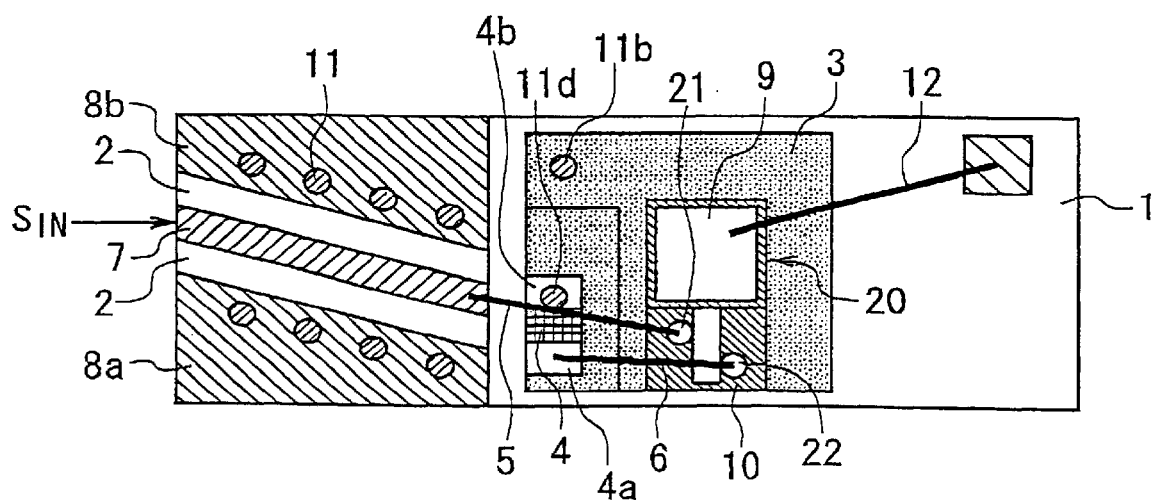
FIG. 5 is a schematic plan view showing the internal configuration of a modulator-integrated light source module according to a second embodiment of the invention.
Figure 6:
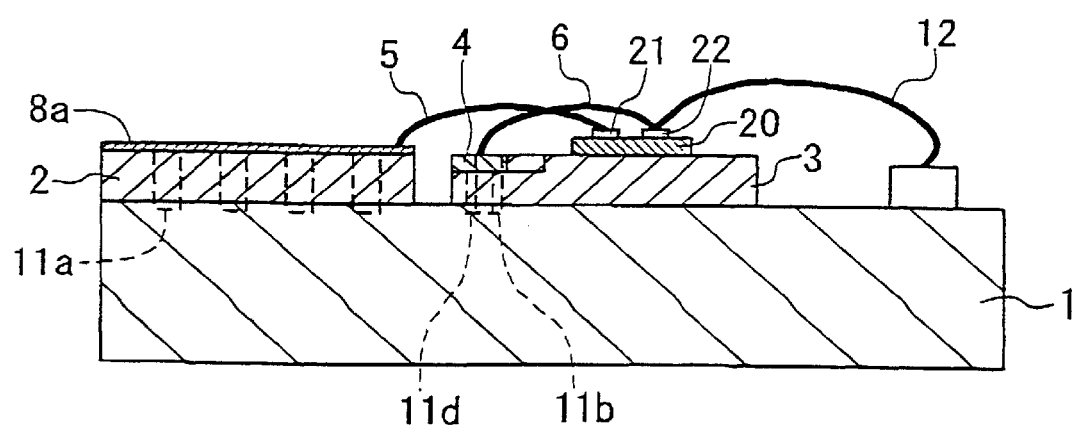
FIG. 6 is a schematic side view showing the internal configuration of the modulator-integrated light source module according to the second embodiment of FIG. 5.

FIGS. 5 and 6 show a high-frequency circuit module (a modulator-integrated light source module) according to a second embodiment of the invention, which comprises the same configuration as the module according to the first embodiment of FIGS. 3 and 4, except that the matching resistor 4 is located on the heat sink 3 near the signal line 7, and that a bonding pad 22 is additionally formed on the modulator 10. Therefore, the description about the same configuration is omitted here by attaching the same reference symbols as those in the first embodiment of FIGS. 3 and 4 for the sake of simplification of description in FIGS. 5 and 6.

In the module of the second embodiment, one end of the bonding wire 5 is bonded to the near end of the signal line 7 while the other end of the wire 5 is bonded to the bonding pad 21 of the external modulator 10 of the chip 20. Thus, the signal line 7 is electrically connected to the modulator 10 by way of the bonding wire 5. This is the same as the first embodiment.

Unlike this, one end of the bonding wire 6 is bonded to the bonding pad 22 (instead of the pad 21) of the modulator 10 of the chip 20 while the other end of the wire 6 is bonded to the terminal 4a of the resistor 4. Thus, the modulator 10 is electrically connected to the resistor 4 by way of the bonding wire 6. The other terminal 4b of the resistor 4 is electrically connected to the base 11 by way of a conductive via hole 11d.

Thus, the signal line 7 is electrically connected to the matching resistor 4 by way of the bonding wires 5 and 6 and the bonding pads 21 and 22.

With the high-frequency circuit module according to the second embodiment of FIGS. 5 and 6, because of the same reason as described in the first embodiment, the degradation of the high-frequency characteristic of the module is prevented even when the lengths of the bonding wires 5 and 6 are decreased.

There is an additional advantage that the possibility of double bonding of the bonding wires 5 and 6 onto the same pad 21, which might occur in the first embodiment, is eliminated.

THIRD EMBODIMENT

Figure 7:
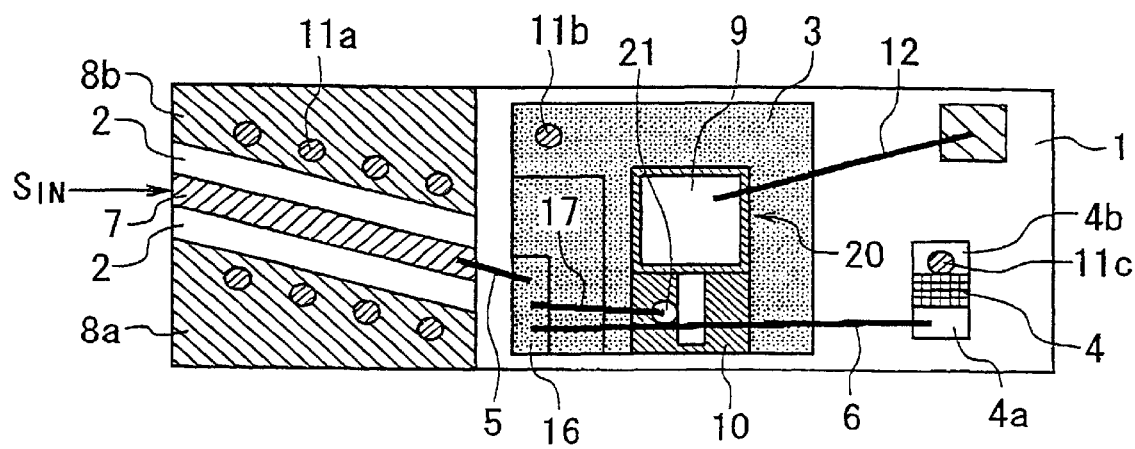
FIG. 7 is a schematic plan view showing the internal configuration of a modulator-integrated light source module according to a third embodiment of the invention.
Figure 8:
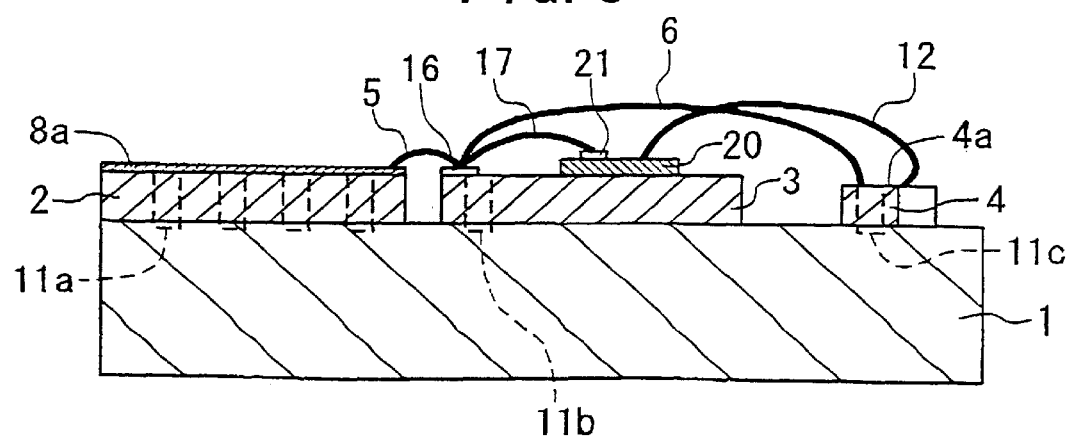
FIG. 8 is a schematic side view showing the internal configuration of the modulator-integrated light source module according to the third embodiment of FIG. 7.

FIGS. 7 and 8 show a high-frequency circuit module (a modulator-integrated light source module) according to a third embodiment of the invention, which comprises the same configuration as the module according to the first embodiment of FIGS. 3 and 4, except that a conductive island 16 is additionally formed on the heat sink 3, and that the ends of the bonding wires 5 and 6 and an additional bonding wire 17 are commonly bonded to the island 16. Therefore, the description about the same configuration is omitted here by attaching the same reference symbols as those in the first embodiment of FIGS. 3 and 4 for the sake of simplification of description in FIGS. 7 and 8.

In the module of the third embodiment, one end of the bonding wire 5 is bonded to the near end of the signal line 7 while the other end of the wire 5 is bonded to the island 16 of the sink 3. One end of the bonding wire 17 is bonded to the same island 16 and the other end thereof is bonded to the bonding pad 21 of the modulator 10. Thus, the signal line 7 is electrically connected to the modulator 10 by way of the bonding wires 5 and 17 and the island 16.

One end of the bonding wire 6 is bonded to the same island 16 of the modulator 10 while the other end of the wire 6 is bonded to the terminal 4a of the resistor 4. Thus, the modulator 10 is electrically connected to the resistor 4 by way of the bonding wires 17 and 6 and the island 16. The other terminal 4b of the resistor 4 is electrically connected to the base 11 by way of the conductive via hole 11c.

The signal line 7 is electrically connected to the matching resistor 4 by way of the bonding wires 5 and 6 and the island 16.

With the high-frequency circuit module according to the third embodiment of FIGS. 7 and 8, because of the same reason as described in the first embodiment, the degradation of the high-frequency characteristic of the high-frequency circuit module is prevented even when the lengths of the bonding wires 5, 6 and 17 are decreased.

There is an additional advantage in the inspection of the fabrication process sequence of the module. Specifically, prior to the process of bonding the wire 6, the optical and electrical characteristics of the external modulator 9 of the chip 20 can be tested. Therefore, according to the result of this test, the process of bonding the wire 6 is carried out for only the modules that have exhibited good test results.

VARIATIONS

Needless to say, the invention is not limited to the above-described first to third embodiments. For example, in the above-described embodiments, the invention is applied to the high-frequency circuit module for optical communication. However, the invention is applicable to any circuit or any module where a signal line for transmitting a high-frequency signal is electrically connected to an element having a capacitance by way of a bonding wire or wires and at the same time, the element is electrically connected to a matching resistor for impedance matching by way of another bonding wire or wires.

If the module of the invention is incorporated into a modulation section of an optical communication device or a electrical communication device (e.g., a portable phone), a communication device having excellent high-frequency characteristics is realized.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A high-frequency circuit comprising:
   (a) an electronic element having a capacitance;
   (b) a signal line for transmitting a high-frequency electric signal to the element;
   (c) a terminating resistor for impedance matching;
   (d) a first bonding wire for electrically connecting the signal line and the element; and
   (e) a second bonding wire for electrically connecting the element and the resistor;
   wherein a characteristic impedance of combination of the element and the first and second bonding wires is equal to or greater than that of input side of the electric signal with respect to the combination;
   and wherein an inductance of the second wire is greater than that of the first wire.

2. The circuit according to claim 1, wherein the element has a conductive pad;
   and wherein the element and the first wire are electrically connected to each other at the pad while the element and the second wire are electrically connected each other at the same pad.

3. The circuit according to claim 1, wherein the element has a first conductive pad and a second conductive pad;
   and wherein the element and the first wire are electrically connected to each other at the first pad while the element and the second wire are electrically connected to each other at the second pad.

4. The circuit according to claim 1, further comprising a conductive island electrically connected to the element by way of a third bonding wire;
   wherein the signal line is electrically connected to the island by way of the first wire, thereby electrically connecting the signal line to the element by way of the first and third wires;
   and wherein the resistor is electrically connected to the island by way of the second wire, thereby electrically connecting the resistor to the element by way of the second and third wires.

5. The circuit according to claim 1, wherein the element is a modulator for generating an electric or optical signal by modulation according to the electric signal transmitted through the signal line.

6. The circuit according to claim 1, wherein the inductance of the second wire is approximately twice in value the inductance of the first wire.

7. A high-frequency circuit module comprising:
   (a) a base; and
   (b) the high-frequency circuit according to claim 1 mounted on the base.

8. The module according to claim 7, wherein the element has a conductive pad;
   and wherein the element and the first wire are electrically connected to each other at the pad while the element and the second wire are electrically connected each other at the same pad.

9. The module according to claim 7, wherein the element has a first conductive pad and a second conductive pad;
   and wherein the element and the first wire are electrically connected to each other at the first pad while the element and the second wire are electrically connected to each other at the second pad.

10. The module according to claim 7, further comprising a conductive island electrically connected to the element by way of a third bonding wire;

wherein the signal line is electrically connected to the island by way of the first wire, thereby electrically connecting the signal line to the element by way of the first and third wires;

and wherein the resistor is electrically connected to the island by way of the second wire, thereby electrically connecting the resistor to the element by way of the second and third wires.

11. The module according to claim 7, wherein the element is a modulator for generating an electric or optical signal by modulation according to the electric signal transmitted through the signal line.

12. The module according to claim 7, wherein the inductance of the second wire is approximately twice in value the inductance of the first wire.

13. The module according to claim 7, wherein the element is mounted on a heat sink fixed to the base and the signal line is located on a dielectric layer formed on the base;

and wherein the resistor is fixed directly on the base.

14. The module according to claim 7, wherein the element is mounted on a heat sink fixed to the base and the signal line is located on a dielectric layer formed on the base;

and wherein the resistor is fixed on the sink.

15. A communication device comprising the module according to claim 7.

* * * * *